United States Patent
Kim et al.

(10) Patent No.: US 10,741,409 B2
(45) Date of Patent: Aug. 11, 2020

(54) METHOD OF MANUFACTURING A SEMICONDUCTOR DEVICE

(71) Applicant: Samsung Electronics Co., Ltd., Suwon-si, Gyeonggi-do (KR)

(72) Inventors: Hyo Jung Kim, Hwaseong-si (KR); Ye Hwan Kim, Seoul (KR); Ki Hoon Jang, Hwaseong-si (KR); Byoung Ho Kwon, Hwaseong-si (KR); Bo Un Yoon, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 240 days.

(21) Appl. No.: 15/722,413

(22) Filed: Oct. 2, 2017

(65) Prior Publication Data

US 2018/0130672 A1  May 10, 2018

(30) Foreign Application Priority Data

Nov. 4, 2016  (KR) .......................... 10-2016-0146772

(51) Int. Cl.
  *H01L 21/321*  (2006.01)
  *H01L 21/762*  (2006.01)
  *H01L 21/02*  (2006.01)
  *H01L 21/3105*  (2006.01)

(52) U.S. Cl.
  CPC .. *H01L 21/32125* (2013.01); *H01L 21/02065* (2013.01); *H01L 21/02074* (2013.01); *H01L 21/31053* (2013.01); *H01L 21/3212* (2013.01); *H01L 21/762* (2013.01); *H01L 21/76224* (2013.01)

(58) Field of Classification Search
  CPC ........ H01L 21/32125; H01L 21/02065; H01L 21/02074; H01L 21/31053; H01L 21/3212; H01L 21/762; H01L 21/76224
  See application file for complete search history.

(56) References Cited

U.S. PATENT DOCUMENTS

| | | | |
|---|---|---|---|
| 8,702,472 B2 | 4/2014 | Morinaga et al. | |
| 9,255,214 B2 | 2/2016 | Lauter et al. | |
| 9,262,010 B2 | 2/2016 | Jiang et al. | |
| 2004/0092210 A1 | 5/2004 | Chen et al. | |
| 2004/0244823 A1 | 12/2004 | Kim et al. | |
| 2007/0219103 A1* | 9/2007 | Du ....................... | C11D 3/2075 510/175 |
| 2008/0153393 A1 | 6/2008 | Chen et al. | |

(Continued)

FOREIGN PATENT DOCUMENTS

| | | |
|---|---|---|
| JP | 5891320 B1 | 3/2016 |
| KR | 2006/0076374 A | 7/2006 |
| KR | 10-0672933 | 1/2007 |

*Primary Examiner* — Timor Karimy
(74) *Attorney, Agent, or Firm* — Harness, Dickey & Pierce, P.L.C.

(57) ABSTRACT

A method of manufacturing a semiconductor device includes preparing an object layer on a substrate; polishing the object layer with a first slurry including a first abrasive having a zeta potential of a first polarity; rinsing a surface of the object layer, using a rinsing solution including a chemical of a second polarity, opposite to the first polarity; and polishing the object layer with a second slurry including a second abrasive having a zeta potential of a second polarity, opposite to the first polarity.

20 Claims, 9 Drawing Sheets

(56) References Cited

U.S. PATENT DOCUMENTS

2008/0242106 A1* 10/2008 Narain ................ B24B 37/0056
  438/759
2012/0142258 A1* 6/2012 Morinaga ............ C09K 3/1463
  451/56

* cited by examiner

METHOD OF MANUFACTURING A SEMICONDUCTOR DEVICE

CROSS-REFERENCE TO RELATED APPLICATION

This application claims priority to Korean Patent Application No. 10-2016-0146772, filed on Nov. 4, 2016 in the Korean Intellectual Property Office, the disclosure of which is incorporated herein by reference in its entirety.

BACKGROUND

The inventive concepts relate to a method of manufacturing a semiconductor device.

A chemical mechanical polishing (CMP) process planarizes the surface of a substrate by combining mechanical polishing by an abrasive with chemical reaction by an acid or base solution.

Such CMP processes are used to, among other things, planarize various types of material in a process of polishing a silicon oxide film for the purpose of forming an inter layer dielectric (ILD) or shallow trench isolation (STI) structure. CMP processes may also be used in tungsten (W) plug formation, copper (Cu) wiring with damascene or dual damascene, and/or the like.

SUMMARY

Example embodiments of the inventive concepts may provide a method of manufacturing a semiconductor device that may reduce the number of defects occurring in a CMP process.

According to example embodiments of the inventive concepts, a method of manufacturing a semiconductor device may include: preparing an object layer on a substrate; polishing the object layer with a first slurry including a first abrasive having a zeta potential of a first polarity; rinsing a surface of the object layer, using a rinsing solution including a chemical of a second polarity, opposite to the first polarity; and polishing the object layer with a second slurry including a second abrasive having a zeta potential of a second polarity, opposite to the first polarity.

According to example embodiments of the inventive concepts, a method of manufacturing a semiconductor device may include: forming a mask pattern on a substrate; forming a trench by etching the substrate to a desired depth, using the mask pattern; forming an insulating layer that fills the trench; polishing the insulating layer with a first slurry including a first abrasive having a zeta potential of a first polarity; rinsing a surface of the insulating layer, using a rinsing solution including a chemical 3 of a second polarity, opposite to the first polarity; and polishing the insulating layer with a second slurry including a second abrasive having a zeta potential of the second polarity.

According to example embodiments of the inventive concepts, a method of manufacturing a semiconductor device may include: forming a trench by etching an interlayer dielectric layer; forming a damascene metal layer filling the trench; polishing the damascene metal layer with a first slurry, the first slurry including a first abrasive having a zeta potential of a first polarity; rinsing a surface of the damascene metal layer using a rinsing solution, the rinsing solution including a chemical of a second polarity, different from the first polarity; and polishing the insulating layer with a second slurry, the second slurry including a second abrasive having a zeta potential of the second polarity.

BRIEF DESCRIPTION OF DRAWINGS

The above, and other aspects, features, and advantages of the disclosure will be more clearly understood from the following detailed description when taken in conjunction with the accompanying drawings, in which.

DETAILED DESCRIPTION

Hereinafter, the example embodiments of the inventive concepts will be described below with reference to the attached drawings.

Figure 1A:
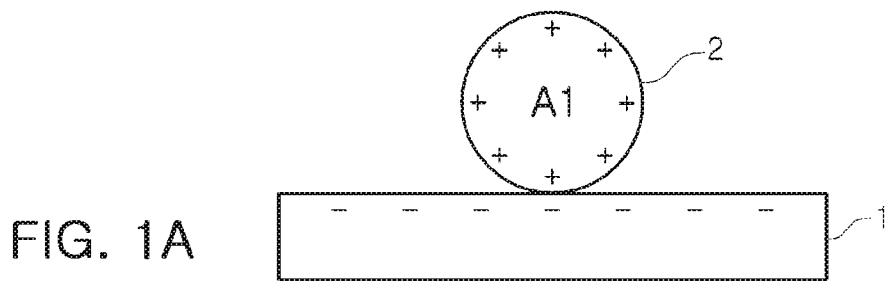
FIGS. 1A, 1B, and 1C are diagrams illustrating a method of manufacturing a semiconductor device according to an example embodiment of the present inventive concepts.
Figure 1B:
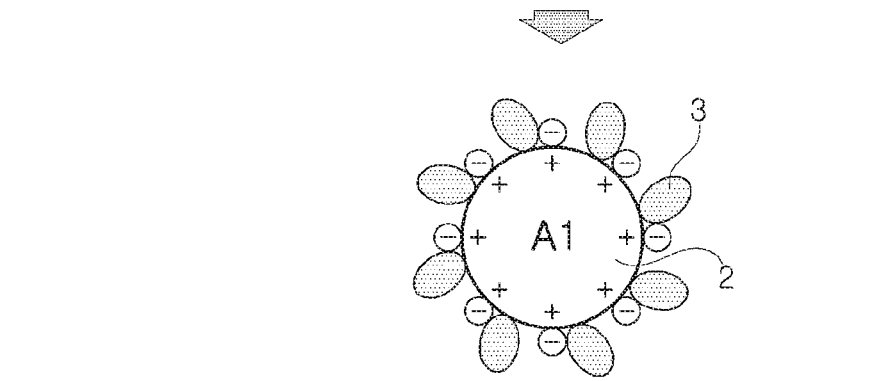
Figure 1C:
Figure 2:
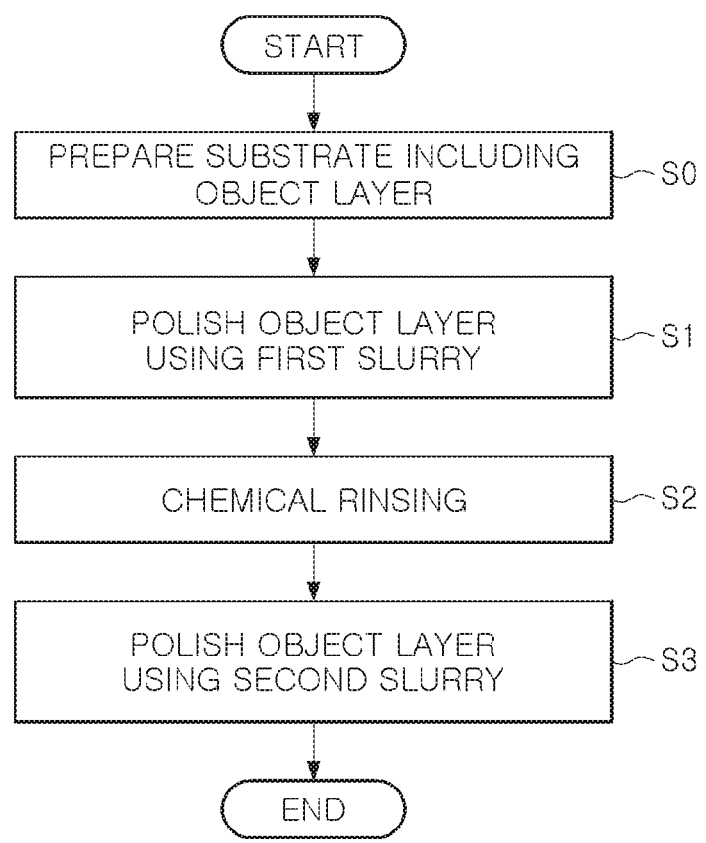
FIG. 2 is a flow chart illustrating a method of manufacturing a semiconductor device according to an example embodiment of the inventive concepts.

FIGS. 1A, 1B, and 1C are diagrams illustrating a method of manufacturing a semiconductor device according to an example embodiment of the inventive concept. FIG. 2 is a flow chart illustrating a method of manufacturing a semiconductor device according to an example embodiment of the inventive concepts.

First, a substrate, on which an object layer 1 is formed, may be prepared in S0 of FIG. 2. In this example embodiment, the object layer 1 may be a silicon oxide layer. In contrast, the object layer 1 may be, in an example embodiment, a metal layer such as a tungsten (W) or copper (Cu) layer.

Referring to FIG. 1A, a first chemical mechanical polishing (CMP) process of polishing the object layer 1, using a first slurry, may be performed in S1 of FIG. 2.

By the first CMP process, the object layer 1 may be polished to a desired thickness. The first slurry may include a first abrasive 2 having a zeta potential of a first polarity. For example, a pH of the first slurry may be between 2 and 6, and the first abrasive may be ceria ($CeO_2$) particles having a zeta potential of a positive polarity. The object layer 1 may be a silicon oxide layer, and a surface of the silicon oxide layer at a pH of 2 or higher may have a zeta potential of a negative polarity. After the first CMP process is completed, the first abrasive 2, for example, ceria particles, may be adsorbed onto the surface of the object layer 1 by electrostatic attraction. Ceria ($CeO_2$) particles may be referred to ceramic particles.

Subsequently, referring to FIG. 1B, in order to separate the first abrasive 2 adsorbed onto the surface of the object layer 1 therefrom, the surface of the object layer 1 may be rinsed using a rinsing solution including a chemical 3 having a second polarity, opposite to the first polarity, in S2 of FIG. 2. Such a rinsing process (a so-called "chemical rinsing process") may allow the first abrasive 2 to have a zeta potential of the same polarity as the object layer 1, thus removing the first abrasive 2 from the surface of the object layer 1.

In this example embodiment, the first polarity may be a positive polarity, and the rinsing solution may include a chemical having a negative polarity. The chemical having the negative polarity may include an anionic polymer. The anionic polymer may include polyacrylic acid, polysulfonic acid, or polyalkyl phosphate. The chemical having the negative polarity may include a chemical having an acrylic acid group, a chemical having a sulfonic acid group, or a chemical having a phosphate group.

Subsequently, referring to FIG. 1C, a second CMP process of polishing the object layer 1, using a second slurry, may be performed in S3 of FIG. 2. The second slurry may include a second abrasive 4 having a zeta potential of the second polarity, opposite to the first polarity. For example, the second abrasive 4 may be silica ($SiO_2$) particles, and the silica particles may have a zeta potential of a negative polarity. A surface of a silicon oxide layer 67a (refer to FIG. 6), an object layer, at a pH of 2 or higher, may have a zeta potential of a negative polarity. Silica ($SiO_2$) particles may be referred to ceramic particles.

The rinsing process using the rinsing solution including the chemical having the polarity opposite that of the zeta potential of the first abrasive 2 may allow the first abrasive 2 adsorbed onto the surface of the object layer 1 to be removed from the surface of the object layer 1, thus inhibiting the first and second abrasives, having the polarities opposite each other, from forming large second particles through electrostatic agglomeration in the second CMP process. As a result, defects, such as scratches that may occur on the surface of the object layer 1 due to the second particles, may be mitigated.

In this example embodiment, the case where the first slurry includes the first abrasive 2 having the zeta potential of the positive polarity and the second slurry includes the second abrasive 4 having the zeta potential of the negative polarity has been described, but the inventive concepts are not limited thereto.

In an example embodiment, in the case where the first slurry includes the first abrasive 2 having a zeta potential of a negative polarity and the second slurry includes the second abrasive 4 having a zeta potential of a positive polarity, the rinsing process using the rinsing solution including the chemical having a polarity opposite to that of the zeta potential of the first abrasive 2 may also allow the first abrasive 2, adsorbed onto the surface of the object layer 1, to be removed from the surface of the object layer 1, thus inhibiting the first and second abrasives, having polarities opposite each other, from forming large second particles through electrostatic agglomeration in the second CMP process.

The rinsing solution may include a chemical having a positive polarity. The chemical having the positive polarity may include a cationic polymer. Cationic polymers known in the related art may be used as the cationic polymer.

The foregoing first CMP process in S1 and chemical rinsing process in S2 may be performed on a first platen of a CMP apparatus, and the foregoing second CMP process in S3 may be performed on a second platen of the CMP apparatus. In an example embodiment, the first CMP process in S1 may be performed on the first platen, and the chemical rinsing process in S2 and the second CMP process in S3 may be performed on the second platen. In an example embodiment, the first CMP process in S1 may be performed on the first platen, the chemical rinsing process in S2 may be performed on the second platen, and the second CMP process in S3 maybe performed on a third platen of the CMP apparatus.

In another example embodiment, the foregoing first CMP process in S1, chemical rinsing process in S2, second CMP process in S3 may be performed on a single platen.

Figure 3:
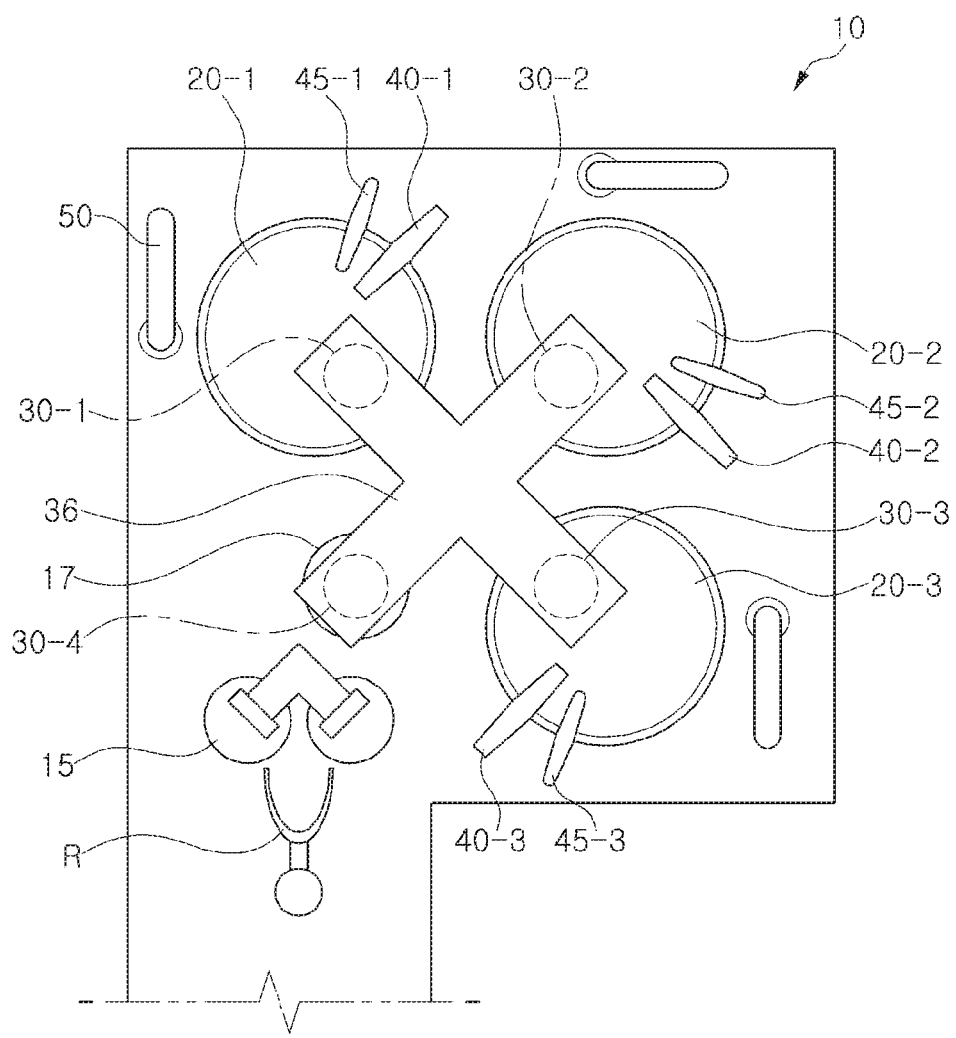
FIG. 3 is a schematic diagram of a chemical mechanical polishing (CMP) apparatus.

FIG. 3 is a schematic diagram of a CMP apparatus.

Referring to FIG. 3, a CMP apparatus 10 may include first to third platens 20-1, 20-2, and 20-3, first to fourth polishing heads 30-1, 30-2, 30-3, and 30-4, first to third slurry supply devices 40-1, 40-2, and 40-3, and first to third rinsing solution supply devices 45-1, 45-2, and 45-3. The CMP apparatus 10 may further include a multihead carousel 36, a conditioner 50, a substrate reversing device 15, a loading/unloading device 17, and a robot R.

The first to third platens 20-1, 20-2, and 20-3 may have polishing pads mounted thereon, respectively. The first platen 20-1 may have the first slurry supply device 40-1 and the first rinsing solution supply device 45-1 on one side thereof. The second platen 20-2 may have the second slurry supply device 40-2 and the second rinsing solution supply device 45-2 on one side thereof. The third platen 20-3 may have the third slurry supply device 40-3 and the third rinsing solution supply device 45-3 on one side thereof.

The first to fourth polishing heads 30-1, 30-2, 30-3, and 30-4 may be attached to the multihead carousel 36, which is rotatable, to be moved onto the first to third platens 20-1, 20-2, and 20-3 and the loading/unloading device 17. The first to fourth polishing heads 30-1, 30-2, 30-3, and 30-4 may be lifted, lowered and rotated, respectively and independently. The substrate reversing device 15 may reverse and transfer an object substrate to the loading/unloading device 17, or may reverse and bring a polished substrate out from the loading/unloading device 17. The robot R may transfer an object substrate to the substrate reversing device 15, or may bring a polished substrate out from the substrate reversing device 15. The conditioner 50 may retain a constant or nearly constant polishing rate by adjusting a state of the polishing pad.

In an example embodiment, the first CMP process using the first slurry may be performed on the first platen 20-1, after the completion of the first CMP process, the chemical rinsing process using a rinsing solution supplied by the first rinsing solution supply device 45-1 may be performed on the first platen 20-1, and when a substrate is transferred to the second platen 20-2, the second CMP process using the second slurry may be performed.

In an example embodiment, the first CMP process, using the first slurry, may be performed on the first platen 20-1; after the completion of the first CMP process, when a substrate is transferred to the second platen 20-2, the chemical rinsing process using a rinsing solution supplied by the second rinsing solution supply device 45-2 may be performed on the second platen 20-2, and the second CMP process using the second slurry may be performed.

In an example embodiment, the first CMP process, using the first slurry, may be performed on the first platen 20-1; after the completion of the first CMP process, when a substrate is transferred to the second platen 20-2, the chemical rinsing process using a rinsing solution supplied by the second rinsing solution supply device 45-2 may be performed on the second platen 20-2, and when the substrate is transferred to the third platen 20-3, the second CMP process using the second slurry may be performed.

The CMP apparatus 10, illustrated in FIG. 3, is an example of a polishing apparatus having multiple platens according to an example embodiment of the inventive concepts. An example embodiment may be employed in a CMP apparatus having various types of structure. For example, an example embodiment may be applied to a CMP apparatus in which multiple platens are linearly arranged.

Figure 4:
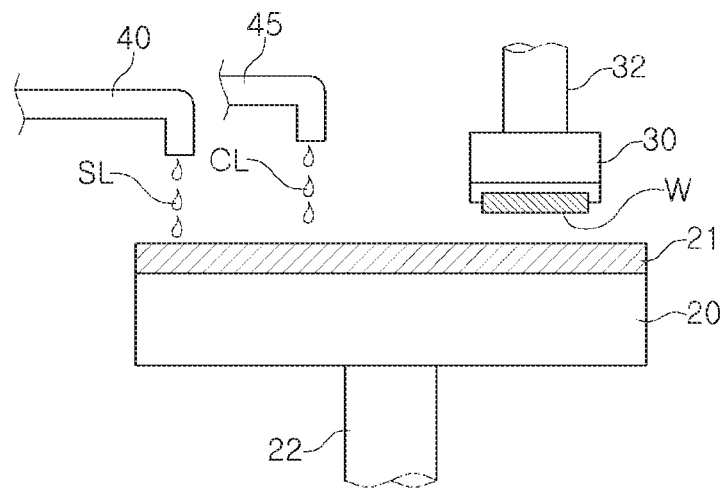
FIG. 4 is a diagram illustrating a CMP process.

FIG. 4 is a diagram illustrating a CMP process.

Referring to FIG. 4, a platen 20 having a polishing pad 21 on a surface thereof may be connected to a first rotary shaft 22. The first rotary shaft 22 may rotate the platen 20 in a first direction. For example, the first rotary shaft 22 may rotate that platen 20 in a first direction. The polishing pad 21 may have a polishing head 30 there above, and a substrate W, to which a CMP process is to be applied, may be mounted on the polishing head 30. A second rotary shaft 32 may rotate the polishing head 30 in a second direction opposite the first direction of the platen 20 by a second rotary shaft 32.

A slurry SL may be supplied to one side of the platen 20 by a slurry supply device 40. The slurry SL may be supplied to the polishing pad 21 being rotated, and then the polishing head 30 may be lowered and rotated, while allowing the substrate W to be in close contact with the polishing pad 21. An object layer of the substrate W may thus be polished.

A rinsing solution supply device 45 may be on one side of the platen 20 to supply a rinsing solution CL for a chemical rinsing process, independent of the slurry supply device 40. Before or after the CMP process, a rinsing solution CL including a chemical may remove an abrasive remaining on a surface of the substrate W.

In an example embodiment of the inventive concepts, the slurry supply device 40 and the rinsing solution supply device 45 may be integrated, and in this case, the slurry SL and the rinsing solution CL may be supplied through different nozzles.

FIGS. 5 through 8 are schematic cross-sectional views illustrating a process of forming a shallow trench isolation (STI) layer according to an example embodiment of the inventive concepts.

Figure 5:
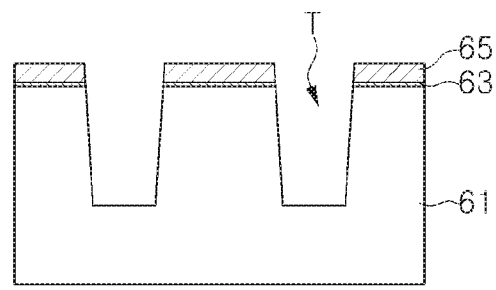
FIGS. 5 through 8 are schematic cross-sectional views illustrating a process of forming a shallow trench isolation (STI) layer according to an example embodiment of the inventive concepts.

Referring to FIG. 5, a pad oxide layer 63 and a mask pattern 65 for trench formation may be formed on a substrate 61.

The pad oxide layer 63 may be formed by, for example, a thermal oxidation process. The mask pattern 65 may include polycrystalline silicon, a silicon nitride layer, and/or a combination thereof, and may be formed by a chemical vapor deposition (CVD) process, and the like, known in the related art. Alternatively or additionally, a hardmask may be used as an etch mask, and may be removed from the substrate 61 after an etching of the substrate. The hardmask may include tetraethyl orthosilicate and may be formed a CVD process, but the inventive concepts are not limited thereto.

The substrate 61 may be etched to a desired depth, using the mask pattern 65 as an etching mask, to form a trench T.

Figure 6:
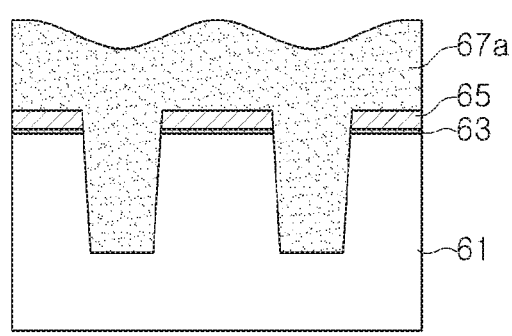

Referring to FIG. 6, the silicon oxide layer 67a may be formed on the substrate 61 to fully fill the trench T and cover the mask pattern 65. This operation may correspond to S0 of FIG. 2. The silicon oxide layer 67a may be formed by the CVD process, and the like, known in the related art.

Figure 7:
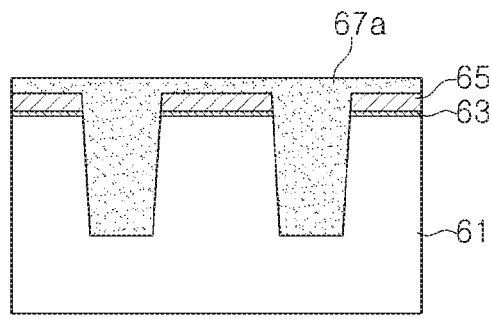

Referring to FIG. 7, the first CMP process of polishing the silicon oxide layer 67a, an object layer, using the first slurry, may be performed in S1 of FIG. 2.

By the first CMP process, the silicon oxide layer 67a may be planarized to remain on the mask pattern 65 at a desired thickness.

The first slurry may include the first abrasive 2, having the zeta potential of the first polarity. For example, the first abrasive 2 may be ceria ($CeO_2$) particles, and a pH of the first slurry maybe between 2 and 6. The ceria particles may have a zeta potential of a positive potential. The surface of the silicon oxide layer 67a, the object layer, at a pH of 2 or higher, may have a zeta potential of a negative polarity. Thus, because the ceria particles may be highly likely to contact the silicon oxide layer 67a during the first CMP process, the silicon oxide layer 67a may be polished at a high speed.

After the first CMP process is completed, the first abrasive 2, for example, ceria particles, may be adsorbed onto the surface of the silicon oxide layer 67a by electrostatic attraction.

The first CMP process using the first slurry may be performed on the first platen 20-1, in the case of using the CMP apparatus having the first to third platens 20-1, 20-2, and 20-3, illustrated in FIG. 3.

Subsequently, in order to separate the first abrasive 2 adsorbed onto the surface of the silicon oxide layer 67a, an object layer, from the surface of the silicon oxide layer 67a, on the first platen 20-1, the substrate 61 may be washed, using the rinsing solution including the chemical having the second polarity, opposite the first polarity in S2 of FIG. 2. For example, as described above, such a rinsing process may allow the first abrasive 2 to have a zeta potential of the same polarity as the silicon oxide layer 67a, thus removing the first abrasive 2 from the surface of the silicon oxide layer 67a.

Figure 8:
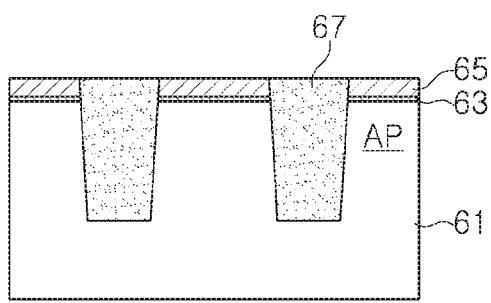

Referring to FIG. 8, the second CMP process of polishing the silicon oxide layer 67a, using the second slurry, may be performed in S3 of FIG. 2. By the second CMP process, the mask pattern 65 may be exposed, and an STI layer 67 may be formed on the substrate 61 to define an active region AP. The mask pattern 65 may function as a stopping layer for the CMP process.

The second CMP process may be performed on the second platen 20-2 of the CMP apparatus 10, as illustrated in FIG. 3. The second slurry may include the second abrasive 4 having the zeta potential of the second polarity, opposite to the first polarity. For example, the second abrasive 4 may be silica ($SiO_2$) particles, and the silica particles may have the zeta potential of the negative polarity. The surface of the silicon oxide layer 67a, the object layer at a pH of 2 or higher, may have the zeta potential of the negative polarity.

The rinsing process may allow the ceria particles, the first abrasive 2, to be removed from the surface of the silicon oxide layer 67a, to inhibit the silica particles and the ceria particles having the polarities opposite each other from forming large second particles through electrostatic agglomeration, and to prevent a defect, such as scratches, that may occur on the surface of the silicon oxide layer 67a due to the second particles.

The second CMP process, using the second abrasive 4, having a zeta potential of the same polarity as the silicon oxide layer 67a, may allow the silicon oxide layer 67a to be polished at a low speed, as compared with the first CMP process. Thus, the silicon oxide layer 67a may be mitigated from being excessively polished.

In an example embodiment, after the substrate 61 is transferred to the second platen 20-2 for the second CMP process, the surface of the silicon oxide layer 67a of the substrate 61 may be washed, using the rinsing solution including the chemical, to separate the ceria particles adsorbed onto the surface of the silicon oxide layer 67a, the object layer, from the surface of the silicon oxide layer 67a the second platen 20-2 in S2 of FIG. 2.

Figure 9:
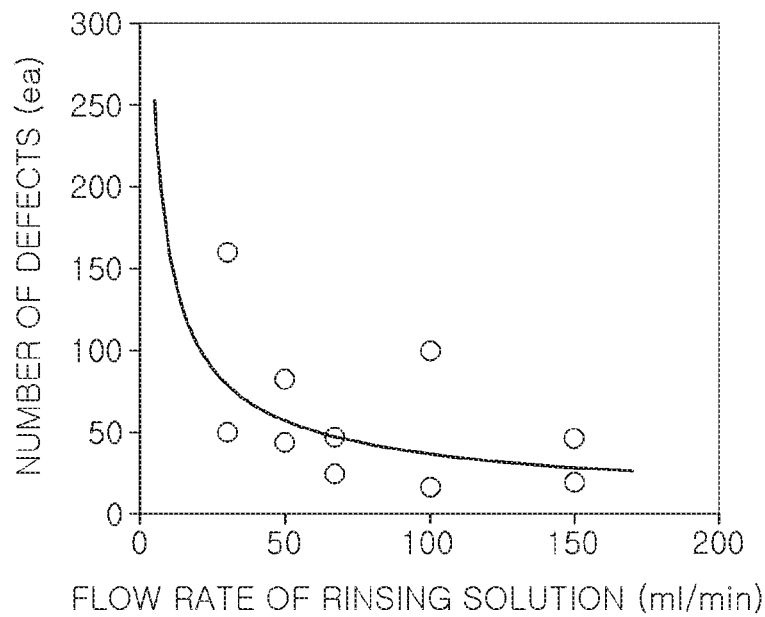
FIG. 9 is a graph of a relationship between defects and a flow rate of a chemical solution employed in an example embodiment of the inventive concepts.

FIG. 9 is a graph of a relationship between number of defects and a flow rate of a rinsing solution including a chemical 3, employed in an example embodiment of the inventive concepts. After the CMP process for the STI process, described with reference to FIGS. 5 through 8, was completed, the number of defects on the surface of the substrate 61 was measured.

Referring to FIG. 9, the number of defects that have occurred on the surface of the object layer after the completion of the CMP process is reduced, as a flow rate of the rinsing solution including the chemical increases. The chemical may include, for example, polyacrylic acid.

Figure 10:
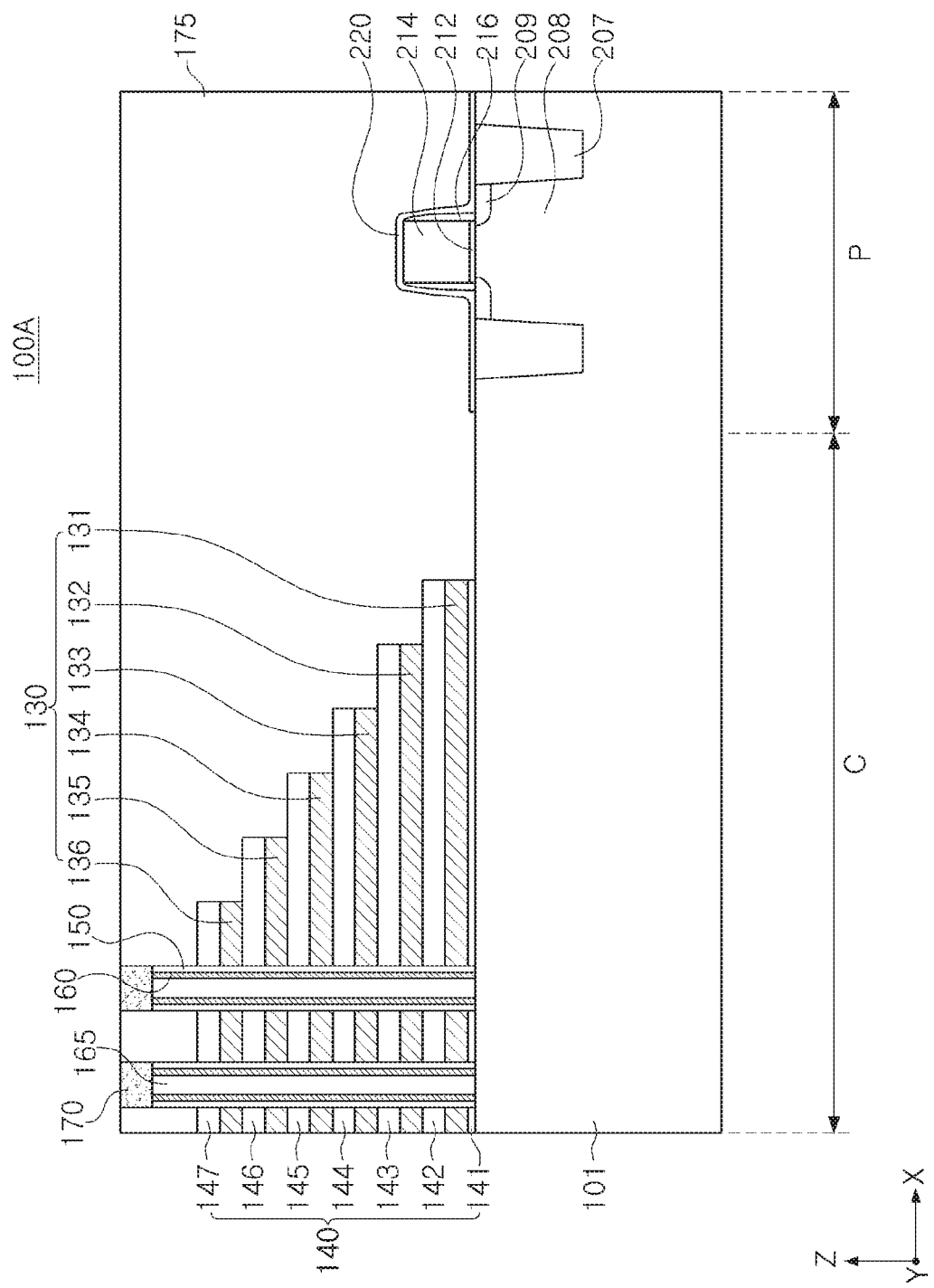
FIGS. 10 and 11 are cross-sectional views of semiconductor devices manufactured by a method of manufacturing a semiconductor device according to an example embodiment of the inventive concepts.
Figure 11:
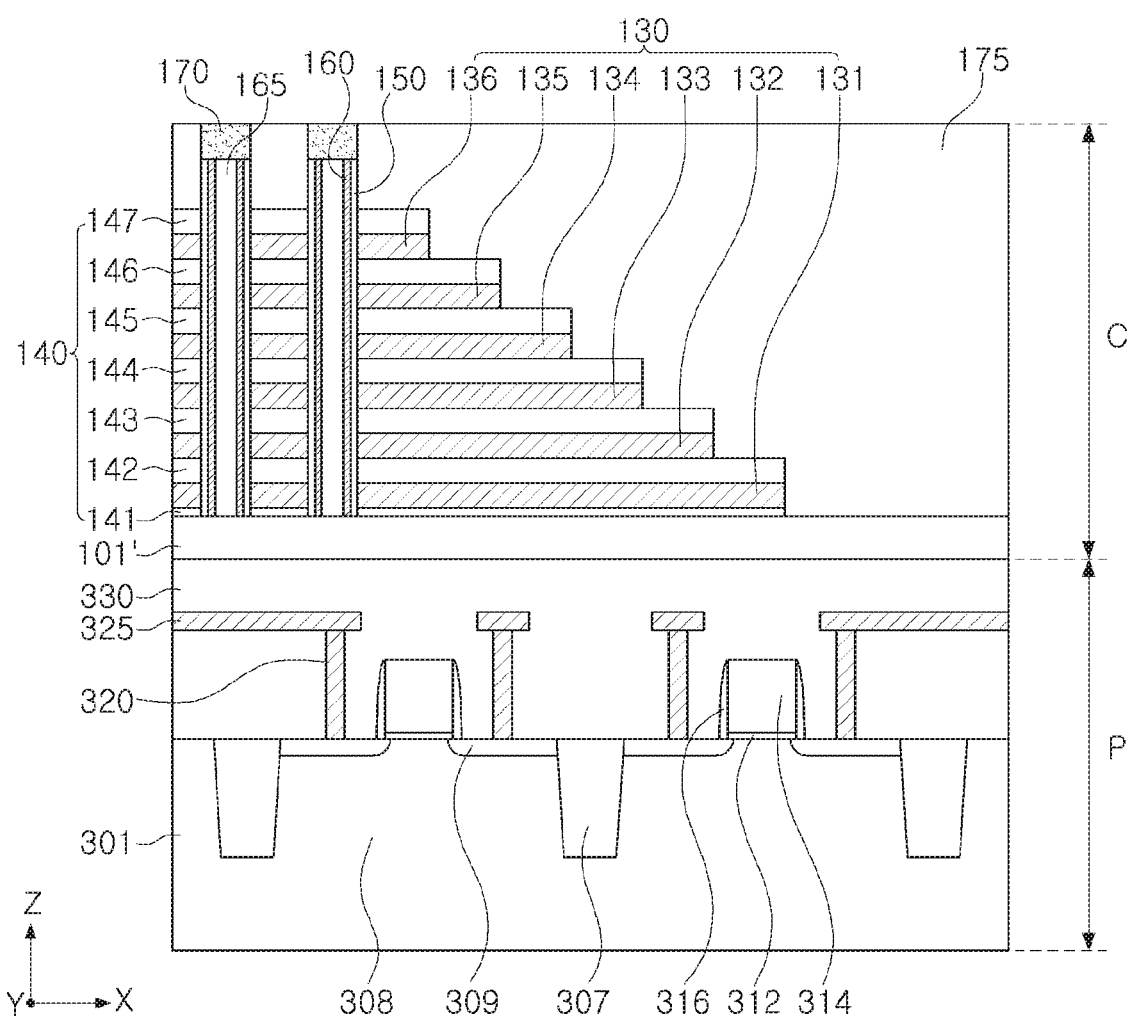

FIGS. 10 and 11 are cross-sectional views of semiconductor devices manufactured by a method of manufacturing a semiconductor device according to an example embodiment of the inventive concepts. Semiconductor devices 100A and 100B, illustrated in FIGS. 10 and 11, may be vertical NAND flash memory devices.

Referring to FIG. 10, a semiconductor device 100A, according to an example embodiment, may include a cell region C and a peripheral circuit region P.

A substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may also be provided as a bulk wafer, an epitaxial layer, a silicon-on-insulator (SOI) layer, a semiconductor-on-insulator (SeOI) layer, and/or the like.

The cell region C may include a plurality of gate electrode layers 131 to 136, collectively represented by gate electrode layer 130 and stacked on an upper surface of the substrate 101 along a Z-axis direction, and a plurality of insulating layers 141 to 147, collectively represented by an insulating layer 140 and alternately with the gate electrode layers 131 to 136. The gate electrode layer 130 and the insulating layer 140 may extend, for example, in an X-axis direction. The cell region C may further include a channel region 160, passing through the gate electrode layer 130 and the insulating layer 140, and extending in a direction substantially perpendicular to the upper surface of the substrate 101, for example, in the Z-axis direction. The channel region 160 may have an annular shape formed by removing a center of an opening portion having a circular cross section. The channel region 160 may also have a filled insulating layer 165 therein. The channel region 160 may be provided as a plurality of channel regions 160, and the channel regions 160 may be at regular intervals. The channel region 160 may have a conductive pad 170 thereon, and the conductive pad 170 may connect the channel region 160 to a bit line. The conductive pad 170 may include, for example, doped polycrystalline silicon.

The closer the gate electrode layers 131 to 136 and the insulating layers 141 to 147 are to the substrate 101, the further the gate electrode layers 131 to 136 and the insulating layers 141 to 147 extend in the X-axis direction, to form a stepped structure. The stepped structure, formed by the gate electrode layers 131 to 136 and the insulating layers 141 to 147, extending by different lengths in the X-axis direction, may be provided as a plurality of pad regions. As illustrated in FIG. 10, the insulating layer 140 may be above the gate electrode layer 130 along the Z-axis direction in the respective pad regions, and, in a different manner, according to an example embodiment, the gate electrode layer 130 may also be above the insulating layer 140.

The gate electrode layer 130 may include a metal material, for example, tungsten (W). According to an example embodiment, the gate electrode layer 130 may include polycrystalline silicon or a metal silicide material. The metal silicide material may be a silicide material of a metal selected from among, for example, cobalt (Co), nickel (Ni), hafnium (Hf), platinum (Pt), tungsten (W) and titanium (Ti), or may be a combination thereof. In addition, the gate electrode layer 130 may further include a diffusion barrier contacting a gate insulating layer 150 and the insulating layer 140, and the diffusion barrier may include, for example, a tungsten nitride (WN), a tantalum nitride (TaN), a titanium nitride (TiN), and/or a combination thereof. The insulation layer 140 may include an insulating material, such as a silicon oxide or a silicon nitride.

The gate insulating layer 150 may be between the channel region 160 and the gate electrode layer 130. The gate insulating layer 150 may include a blocking layer, a charge storage layer, a tunneling layer, and the like. The tunneling layer may contact the channel region 160, and the blocking layer may contact the gate electrode layer 130. The gate insulating layer 150 may extend to the substrate 101 along the channel region 160. According to an example embodiment, the charge storage layer and the tunneling layer of the gate insulating layer 150 may be outwardly of the channel region 160, to extend parallel to the channel region 160, and the blocking layer may surround the gate electrode layer 130. According to an example embodiment, the gate insulating layer 150 may surround the gate electrode layer 130. The blocking layer may include a silicon oxide ($SiO_2$), a silicon nitride ($Si_3N_4$), a silicon oxynitride (SiON) or a high-k dielectric material. The high-k dielectric material may be any one among an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). The blocking layer may selectively include a plurality of layers having different dielectric constants. A layer having a relatively low dielectric constant maybe closer to the channel region 160 than a layer having a relatively high dielectric constant. The charge storage layer may be an insulating layer including a charge trapping layer or conductive nanoparticles. The charge trapping layer may include, for example, a silicon nitride. The tunneling layer may include a material having a dielectric constant lower than that of the blocking layer. The tunneling layer may include at least one of a silicon oxide ($SiO_2$), a silicon nitride ($Si_3N_4$), a silicon oxynitride (SiON), a hafnium oxide ($HfO_2$), a hafnium silicon oxide ($HfSi_xO_y$), an aluminum oxide ($Al_2O_3$), and a zirconium oxide ($ZrO_2$).

The peripheral circuit region P may include an STI layer 207, defining an active region 208, and a gate electrode 214 on the active region 208. A gate insulating layer 212 may be interposed between the active region 208 and the gate electrode 214. The gate electrode 214 may have gate spacers 216 on both side surfaces thereof. The gate electrode 214 may have source/drain regions 209 formed in the active region 208 of both sides thereof, and the source/drain regions 209 may be doped with an n- or p-type impurity. The active region 208 and the gate electrode 214 may form peripheral transistors. The peripheral transistors may form peripheral circuits for operations of the semiconductor device 100A.

The STI layer 207 may be formed through an STI process. A process of forming the STI layer 207 may include a CMP process employed in an example embodiment of the inventive concepts.

For convenience, FIG. 10 illustrates the STI layer 207 in only the peripheral circuit region P, and an STI layer formed through the STI process may be included in the cell region C. The STI layer, formed in the cell region C, may be simultaneously formed with the STI layer 207 included in the peripheral circuit region P.

The gate electrode 214 may include at least one of polysilicon, a metal, for example, tungsten (W) or molybdenum (Mo), or a metal silicide. The gate electrode 214 may also have a structure in which a polysilicon layer and a metal silicide layer are stacked. The gate insulating layer 212 may include a silicon oxide ($SiO_2$), a silicon nitride ($Si_3N_4$), a silicon oxynitride (SiON) or a high-k dielectric material. The gate spacers 216 may include a silicon oxide ($SiO_2$), a silicon nitride ($Si_3N_4$), a silicon oxynitride (SiON) or a combination thereof.

The gate electrode 214, the STI layer 207, and an etch stop layer 220 covering a portion of the substrate 101, may be formed in the peripheral circuit region P. The gate spacers 216 may include a silicon nitride ($Si_3N_4$), a silicon oxynitride (SiON) or a combination thereof.

An interlayer insulating layer 175 may be on the substrate 101 over the cell region C and the peripheral circuit region P. In the cell region C, the interlayer insulating layer 175 may cover the gate electrode layer 130 and the insulating layer 140, and in the peripheral circuit region P, the interlayer insulating layer 175 may cover the etch stop layer 220. In an example embodiment, the interlayer insulating layer 175 may be on another interlayer insulating layer previously formed in the peripheral circuit region P.

FIG. 11 is a cross-sectional view of a semiconductor device according to an example embodiment of the inventive concepts.

Referring to FIG. 11, a semiconductor device 100B, according to an example embodiment, may include a cell region C and a peripheral circuit region P in a vertical direction.

The cell region C may correspond to a region in which a memory cell array is arranged, and the peripheral circuit region P may correspond to a region in which a driver circuit and/or the like is arranged. As illustrated in FIG. 11, the cell region C may be on an upper end of the peripheral circuit region P, but in an example embodiment, the cell region C may also be on a lower end of the peripheral circuit region P.

The cell region C may have the same structure as that in FIG. 10. The components that have been described with reference to FIG. 10 may be applied to this example embodiment, as well, and thus repeated descriptions will be omitted.

A substrate 101' may have the same size as a base substrate 301, or may be smaller than the base substrate 301. The substrate 101' may be formed of polycrystalline silicon or formed of an amorphous silicon and then monocrystallized.

A peripheral circuit region P may include the base substrate 301, an STI layer 307 defining an active region 308, and a gate electrode 314 on the active region 308. A gate insulating layer 312 may be interposed between the active region 308 and the gate electrode 314. The gate electrode 314 may have gate spacers 316 on both side surfaces thereof.

The gate electrode 314 may have source/drain regions 309 formed in the active region 308 of both sides thereof, and the source/drain regions 209 may be doped with an n- or p-type impurity. The peripheral circuit region P may include contact plugs 320 connected to the source/drain regions 309, and wiring lines 325 connected to the contact plugs 320.

The STI layer 307 may be formed through an STI process. A process of forming the STI layer 307 may include the CMP process employed in an example embodiment of the inventive concepts.

An insulating layer 330 may be on the base substrate 301 to cover the gate electrode 314. The wiring lines 325 may be connected to the contact plugs 320, and in some example embodiments, may be in a plurality of layers.

The cell region C and the peripheral circuit region P may be connected to each other in a region not illustrated.

FIGS. 12 through 15 are schematic cross-sectional views illustrating a process of forming a damascene metal layer according to an example embodiment of the inventive concepts.

Figure 12:
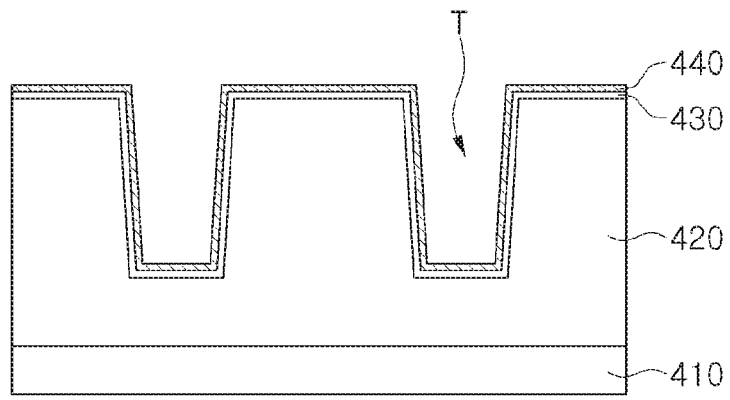
FIGS. 12 through 15 are schematic cross-sectional views illustrating a process of forming a damascene metal layer according to an example embodiment of the inventive concepts.

Referring to FIG. 12, a metal barrier layer 430 and a seed layer 440 may be formed on the sides of trenches T of an inter-layer dielectric layer 420. The inter-layer dielectric layer 420 may include an oxide layer. The inter-layer dielectric layer 420 may include a low-k dielectric material.

The metal barrier layer 430 and the seed layer 440 may be formed by, for example, physical vapor deposition (PVD), atomic layer deposition (ALD), chemical vapor deposition (CVD), and/or other deposition methods, and the inventive concepts are not limited thereto. The metal barrier layer 430 may include a metal nitride, e.g., tantalum nitride, titanium nitride, etc., and/or a metal, e.g. tantalum, titanium, etc. The seed layer 440 may include copper or tungsten, but the inventive concepts are not limited thereto.

The inter-layer dielectric 420 may be etched to a desired depth to form a trench T.

Figure 13:
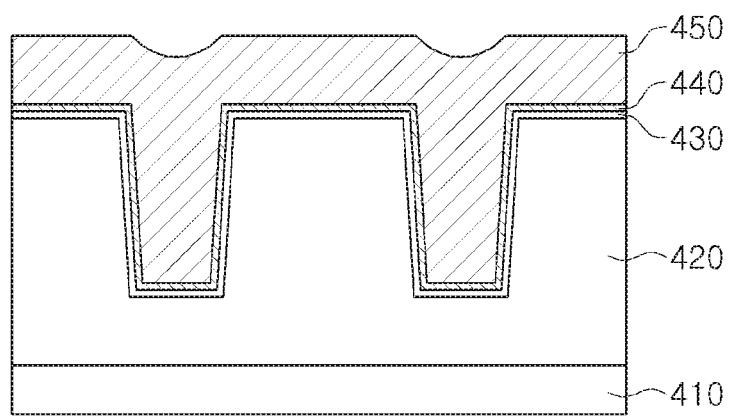

Referring to FIG. 13, the damascene metal layer 450 may be formed on the inter-layer dielectric layer 420 to fully fill the trench T and cover the seed layer 440. The damascene metal layer 450 may include copper. The damascene metal layer 450 maybe formed by an electrochemical deposition process, and/or the like, known in the related art.

Figure 14:
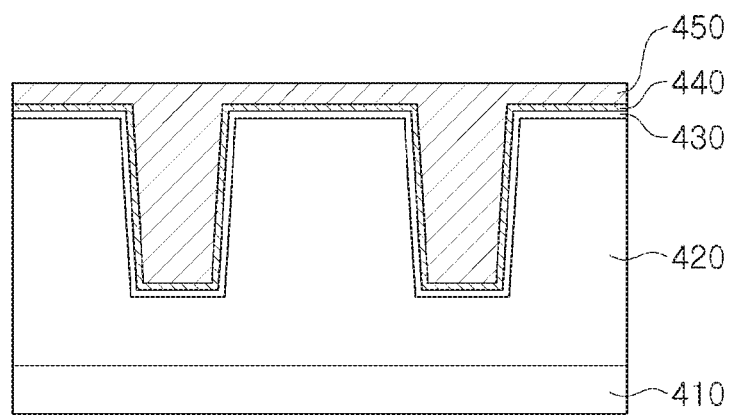

Referring to FIG. 14, the first CMP process of polishing the damascene metal layer 450, using the first slurry, may be performed By the first CMP process, the damascene metal layer 450 may be planarized to remain at a desired thickness.

The first slurry may include the first abrasive 2, having the zeta potential of the first polarity. For example, the first abrasive 2 may be alumina ($Al_2O_3$) particles. The alumina particles may have a zeta potential of a first potential. The surface of the damascene metal layer 450, the object layer, may have a zeta potential of a different polarity. Thus, because the alumina particles maybe highly likely to contact the damascene metal layer 450 during the first CMP process, the damascene metal layer 450 may be polished at a high speed.

After the first CMP process is completed, the first abrasive 2, for example, alumina particles, may be adsorbed onto the surface of the damascene metal layer 450 by electrostatic attraction.

The first CMP process using the first slurry may be performed on the first platen 20-1, in the case of using the CMP apparatus having the first to third platens 20-1, 20-2, and 20-3, illustrated in FIG. 3.

Subsequently, in order to separate the first abrasive 2 adsorbed onto the surface of the damascene metal layer 450, an object layer, from the surface of the damascene metal layer 450, on the first platen 20-1, the substrate 410 may be washed, using the rinsing solution including the chemical having the second polarity, opposite the first polarity. For example, as described above, such a rinsing process may allow the first abrasive 2 to have a zeta potential of the same polarity as the damascene metal layer 450, thus removing the first abrasive 2 from the surface of the damascene metal layer 450.

Figure 15:
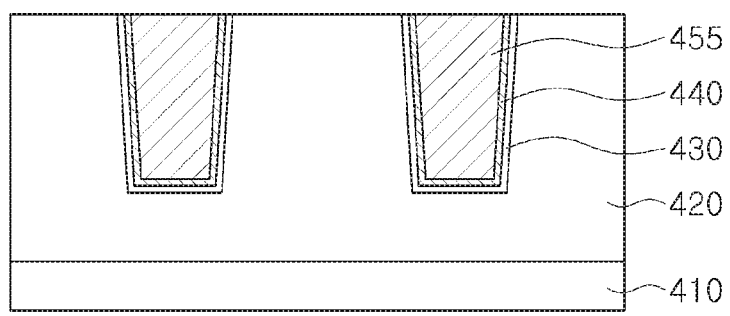

Referring to FIG. 15, the second CMP process of polishing the damascene metal layer 450, using the second slurry, may be performed. By the second CMP process, inter-layer dielectric layer 420 may be exposed, and conductive metal layer 455 may be formed on the inter-layer dielectric layer 420 to define a wiring. The wiring may be a via, or may be a runner. The inter-layer dielectric layer 420 may function as a stopping layer for the CMP process. However, the inventive concepts are not limited thereto.

The second CMP process may be performed on the second platen 20-2 of the CMP apparatus 10, as illustrated in FIG. 3. The second slurry may include the second abrasive 4 having the zeta potential of the second polarity, opposite to the first polarity. For example, the second abrasive 4 may be silica ($SiO_2$) particles, and the silica particles may have the zeta potential of the negative polarity.

The rinsing process may allow the alumina particles, the first abrasive 2, to be removed from the surface of the damascene metal layer 450, to inhibit the silica particles and the alumina particles having the polarities opposite each other from forming large second particles through electrostatic agglomeration, and to prevent a defect, such as scratches, that may occur on the surface of the damascene metal layer 450 due to the second particles.

The second CMP process, using the second abrasive 4, having a zeta potential of the same polarity as the damascene metal layer 450, may allow the damascene metal layer 450 to be polished at a low speed, as compared with the first CMP process. Thus, the damascene metal layer 450 may be mitigated from being excessively polished.

In an example embodiment, after the substrate 410 is transferred to the second platen 20-2 for the second CMP process, the surface of the damascene metal layer 450 of the substrate 410 may be washed, using the rinsing solution including the chemical, to separate the ceria particles adsorbed onto the surface of the damascene metal layer 450, the object layer, from the surface of the damascene metal layer 450.

As set forth above, according to example embodiments of the inventive concepts, a semiconductor device that may reduce the number of defects by a CMP process may be manufactured.

While example embodiments of the inventive concepts have been shown and described above, it will be apparent to those skilled in the art that modifications and variations could be made without departing from the scope of the inventive concepts, as defined by the appended claims.

What is claimed is:

1. A method of manufacturing a semiconductor device, comprising:
    polishing an object layer of a substrate with a first slurry, the first slurry including a first abrasive having a zeta potential of a first polarity;
    rinsing a surface of the object layer using a rinsing solution, the rinsing solution including a chemical having a zeta potential of a second polarity, opposite to the first polarity; and
    polishing the object layer with a second slurry, the second slurry including a second abrasive having a zeta potential of the second polarity.

2. The method of claim 1, wherein, in the polishing the object layer with the first slurry, the first abrasive having a zeta potential of the first polarity is a ceramic particle having a zeta potential of a positive polarity, and the second abrasive having a zeta potential of the second polarity is a ceramic particle having a zeta potential of a negative polarity.

3. The method of claim 2, wherein the chemical of the second polarity includes at least one of a chemical having an acrylic acid group, a chemical having a sulfonic acid group, and a chemical having a phosphate group.

4. The method of claim 2, wherein the chemical of the second polarity includes at least one of polyacrylic acid, polysulfonic acid, polyalkyl phosphate.

5. The method of claim 1, wherein, in the polishing the object layer with the first slurry, the first abrasive having a zeta potential of the first polarity has a zeta potential of a polarity opposite to a polarity of the object layer.

6. The method of claim 1, wherein, in the polishing the object layer with the first slurry, the first abrasive having a zeta potential of the first polarity is a ceramic particle having a zeta potential of a negative polarity, the second abrasive having a zeta potential of the second polarity is a ceramic particle having a zeta potential of a positive polarity, and the chemical of the second polarity includes a cationic polymer.

7. The method of claim 1, wherein the polishing the object layer with the first slurry, a same platen performs the rinsing the surface of the object layer and the polishing the object layer with the second slurry.

8. The method of claim 1, wherein a first platen performs the polishing the object layer with the first slurry, and a second platen performs the polishing the object layer with the second slurry.

9. The method of claim 8, wherein the first platen performs the rinsing the surface of the object layer after the first platen performs polishing the object layer with the first slurry.

10. The method of claim 8, wherein the second platen performs the rinsing the surface of the object layer before the second platen performs the polishing the object layer with the second slurry.

11. The method of claim 8, wherein a platen different from the first platen and the second platen performs the rinsing the surface of the object layer between the polishing the object layer with the first slurry and the polishing the object layer with the second slurry.

12. The method of claim 1, wherein the rinsing the surface of the object layer using the rinsing solution includes,
    supplying the rinsing solution having the zeta potential opposite that of the first abrasive onto the surface of the substrate.

13. A method of manufacturing a semiconductor device, comprising:
    polishing an object layer of a substrate with a first slurry, the first slurry including ceria, the first slurry having a negative zeta potential;
    supplying a rinsing solution to a surface of the object layer, the rinsing solution including a cationic polymer, the rinsing solution supplied to the object layer having a positive zeta potential; and
    polishing the object layer with a second slurry, the second slurry including silica, the second slurry having a positive zeta potential.

14. The method of claim 13, wherein,
the polishing the object layer with the first slurry includes polishing the object layer on a first platen,
the supplying the rinsing solution includes supplying the rinsing solution on the first platen, and
the polishing the object layer with the second slurry includes polishing the object layer on a second platen.

15. The method of claim 13, wherein,
the polishing the object layer with the first slurry includes polishing the object layer on a first platen,
the supplying the rinsing solution includes supplying the rinsing solution on a second platen, and
the polishing the object layer with the second slurry includes polishing the object layer on the second platen.

16. A method of manufacturing a semiconductor device, comprising:
polishing an object layer of a substrate with a first slurry, the first slurry including silica, the first slurry having a positive zeta potential;
supplying a rinsing solution to a surface of the object layer, the rinsing solution including an anionic polymer, the rinsing solution supplied to the object layer having a negative zeta potential; and
polishing the object layer with a second slurry, the second slurry including a ceria, the second slurry having a negative zeta potential.

17. The method of claim 16, wherein,
the polishing the object layer with the first slurry includes polishing the object layer on a first platen,
the supplying the rinsing solution includes supplying the rinsing solution on the first platen, and
the polishing the object layer with the second slurry includes polishing the object layer on a second platen.

18. The method of claim 16, wherein,
the polishing the object layer with the first slurry includes polishing the object layer on a first platen,
the supplying the rinsing solution includes supplying the rinsing solution on a second platen, and
the polishing the object layer with the second slurry includes polishing the object layer on the second platen.

19. The method of claim 16, wherein,
the polishing the object layer with the first slurry includes polishing the object layer on a first platen,
the supplying the rinsing solution includes supplying the rinsing solution on a second platen, and
the polishing the object layer with the second slurry includes polishing the object layer on a third platen.

20. The method of claim 16, wherein a pH of the second slurry is between 2 and 6.

* * * * *